United States Patent
DeMarco et al.

(10) Patent No.: US 9,841,467 B2
(45) Date of Patent: Dec. 12, 2017

(54) METHODS AND SYSTEMS FOR DETECTING VEHICLE CHARGING SYSTEM FAULTS

(71) Applicant: Ford Global Technologies, LLC, Dearborn, MI (US)

(72) Inventors: John Anthony DeMarco, Lake Orion, MI (US); Robert Michael Grant, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 14/511,254

(22) Filed: Oct. 10, 2014

(65) Prior Publication Data
US 2016/0103189 A1   Apr. 14, 2016

(51) Int. Cl.
| | |
|---|---|
| G01R 1/06 | (2006.01) |
| H02J 7/00 | (2006.01) |
| G01R 31/40 | (2014.01) |
| G01R 31/34 | (2006.01) |
| G01R 31/00 | (2006.01) |

(52) U.S. Cl.
CPC .......... *G01R 31/40* (2013.01); *G01R 31/343* (2013.01); *G01R 31/007* (2013.01)

(58) Field of Classification Search
CPC ..... G01R 31/40; G01R 31/362; G01R 31/006
USPC .............................. 320/109; 324/149, 764.01
See application file for complete search history.

(56) References Cited

U.S. PATENT DOCUMENTS

| | | | | |
|---|---|---|---|---|
| 5,929,609 | A * | 7/1999 | Joy | H02J 7/1446 322/23 |
| 6,194,877 | B1 * | 2/2001 | Judge | H02J 7/1461 320/162 |
| 6,363,303 | B1 | 3/2002 | Bertness | |
| 7,180,272 | B2 | 2/2007 | Okahara et al. | |
| 2010/0253357 | A1 * | 10/2010 | Seo | G01R 19/16542 324/427 |

OTHER PUBLICATIONS http://easyautodiagnostics.com/alternator_tests/alternator_diagno. . . , Helping the Serious Do-It-Yourself'er Get the Job Done!, Testing a BAD Alternator: Symptoms and Diagnosis—Part I—, 2009-2014, pp. 1-3.
http://easyautodiagnostics.com/alternator_tests/alternator_diagno . . . , Helping the Serious Do-It-Yourself'er Get the Job Done!, Testing a BAD Alternator: Symptoms and Diagnosis—Part II—, 2009-2014, pp. 1-3.
http://easyautodiagnostics.com/alternator_tests/alternator_diagnostic_tests_3.php, Helping the Serious Do-It-Yourself'er Get the Job Done!, Testing a BAD Alternator: Symptoms and Diagnosis—Part III—, 2009-2014, pp. 1-3.
(Continued)

*Primary Examiner* — Farhana Hoque
(74) *Attorney, Agent, or Firm* — Frank A. MacKenzie; Brooks Kushman P.C.

(57) ABSTRACT

A vehicle may include a vehicle charging system having an alternator operatively coupled to an engine and a controller. The controller may be programmed to output a warning indicative of a vehicle charging system fault in response to a quotient of a voltage drop associated with the alternator and an output current of the alternator exceeding a threshold value while the alternator is operating in a steady state condition.

7 Claims, 2 Drawing Sheets

(56) References Cited

OTHER PUBLICATIONS http://troubleshootmyvehicle.com/ford/4.6L-5/4L/ford-p0620-alt. . . , Helping the DIYer When the Manual Just Doesn't Cut it!, Ford P0620 Test—Alternator Diagnostic Test—Jun. 6, 2014, Part I, pp. 1-3.
http://troubleshootmyvehicle.com/ford/4.6L-5/4L/ford-p0620-alt. . . , Helping the DIYer When the Manual Just Doesn't Cut it!, Ford P0620 Test—Alternator Diagnostic Test—Part II, Jun. 6, 2014, pp. 1-3.

* cited by examiner

METHODS AND SYSTEMS FOR DETECTING VEHICLE CHARGING SYSTEM FAULTS

TECHNICAL FIELD

The present disclosure relates to detecting vehicle charging system faults.

BACKGROUND

Vehicles may be provided with an apparatus for detecting a malfunction of an on-vehicle charging system. The apparatus may detect a voltage generated by the generator and detect a voltage across the battery. The apparatus may include a malfunction determination unit determining whether or not a malfunction occurs in the charging system on the basis of the detected voltages.

SUMMARY

A method of detecting a vehicle charging system fault may include, in response to a quotient of a voltage drop associated with an alternator and an output current associated with the alternator exceeding a threshold value while the alternator is operating in a steady state condition, outputting for display a warning indicative of a vehicle charging system fault.

A method of monitoring a vehicle charging system may include outputting an alert indicative of a vehicle charging system fault in response to a connector resistance exceeding a threshold while a battery is under charge. The connector resistance may be based on an engine speed, an excitation current associated with a generator, and a difference between a voltage associated with the generator and a voltage associated with a power distribution point.

A vehicle may include a vehicle charging system having an alternator operatively coupled to an engine and a controller. The controller may be programmed to output a warning indicative of a vehicle charging system fault in response to a quotient of a voltage drop associated with an alternator and an output current of the alternator exceeding a threshold value while the alternator is operating in a steady state condition.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
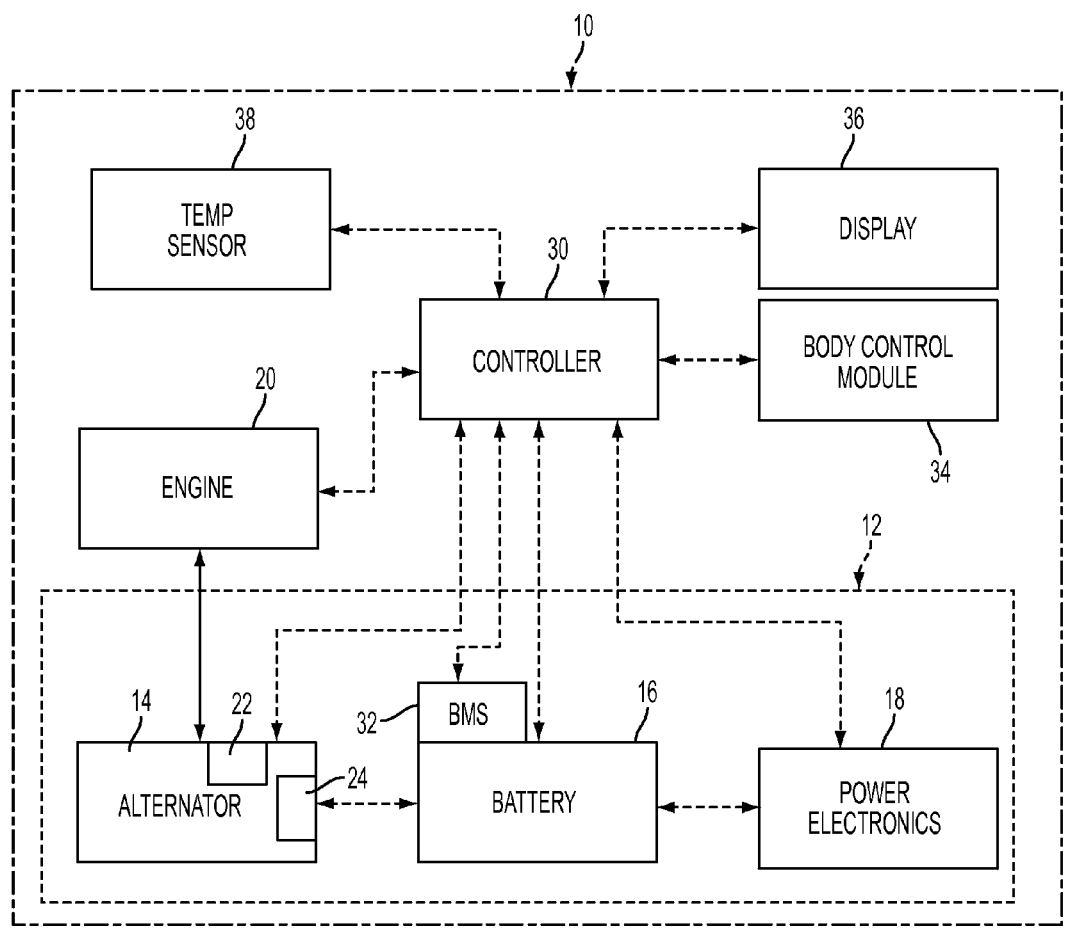
FIG. 1 is a schematic diagram of a vehicle.

Referring to FIG. 1, a schematic diagram of a vehicle 10 is illustrated according to an embodiment of the present disclosure. Physical placement and orientation of the components within the vehicle 10 may vary. The vehicle 10 may include a vehicle charging system 12. The vehicle charging system 12 may include an alternator 14, a battery 16, and power electronics 18.

The alternator 14, which may be commonly referred to as a generator, may be coupled to an engine 20. The alternator 14 may be configured to rotate as the engine 20 rotates. The engine 20 generally represents a power source which may include an internal combustion engine such as a gasoline, diesel, or natural gas powered engine, or a fuel cell. The engine 20 may generate power and corresponding torque that is supplied to a vehicle transmission (not shown).

The rotation of the alternator 14 may spin a rotor about a stator to produce a magnetic field that may create an electrical current in the stator. The changing magnetic field encountered by the stator may cause a current to be induced in the stator coils.

The stator may be provided with electrical windings that are connected to a rectifier. The rectifier may take an alternating current output from the stator and convert the alternating current output into a direct current output. The output of the rectifier may be coupled to a voltage regulator 22 and an output terminal 24 of the alternator 14. The current after being rectified by the rectifier may become the alternator output current.

The current that may flow through a rotor coil of the alternator 14 may be referred to as an excitation current or field current. The excitation current may be controlled by the voltage regulator 22. The voltage regulator 22 may sense an alternator output voltage and compare the present alternator output voltage to a desired or target alternator output voltage. The voltage regulator 22 may adjust the excitation current or an alternator speed or alternator loading to satisfy the desired or target alternator output voltage, because the alternator output current may be a function of an alternator speed and the excitation current.

The voltage regulator 22 may regulate the alternator output voltage such that power is provided to electrical components by the battery 16. The voltage regulator 22 may ensure that the battery 16 receives a desired voltage to reduce the possibility of damage to the battery 16 or electrical components of the vehicle.

The output of the rectifier may be coupled to the output terminal 24 of the alternator 14. The output terminal 24 may be referred to as a B+ connector. The output terminal 24 may be connected to the battery 16 by a cable extending between a pair of connectors coupled to the output terminal 24 and the battery 16 such that the alternator 14 provides electrical current to charge the battery 16.

Operation of various vehicle components and the vehicle charging system 12 may be dictated or influenced by at least one controller 30. The controller 30 may be a member of a larger control system including several controllers that may be subservient to a vehicle system controller.

The controller 30 may include at least one microprocessor or central processing unit (CPU) in communication with various types of computer readable storage devices or media. Computer readable storage devices or media may include volatile and nonvolatile storage in read-only memory (ROM), random-access memory (RAM), and keep-alive memory (KAM), for example. KAM is a persistent or non-volatile memory that may be used to store various operating variables while the CPU is powered down. Computer-readable storage devices or media may be implemented using any of a number of known memory devices such as PROMs (programmable read-only memory), EPROMs (electrically PROM), EEPROMs (electrically erasable PROM), flash memory, or any other electric, magnetic, optical, or combination memory devices capable of storing data, some of which represent executable instructions, used by the controller in controlling the engine or vehicle.

The controller 30 may communicate with various engine/vehicle sensors and actuators via input communication channels and output communication channels that may be implemented as a single integrated interface that provides various raw data or signal conditioning, processing, and/or conversion, short-circuit protection, and the like. Alternatively, one or more dedicated hardware or firmware chips may be used to condition and process particular signals before being supplied to the CPU.

The controller 30 may communicate signals to and/or from other vehicle controllers, or directly with components including the alternator 14, the battery 16, power electronics 18, the engine 20, a battery monitoring system 32, a body control module 34, a vehicle display interface 36, and a temperature sensor 38.

Sensors communicating input communication channels through the interface may be used to indicate turbocharger boost pressure, turbocharger rotation speed, crankshaft position, engine rotational speed (RPM), wheel speeds, vehicle speed, engine coolant temperature, ambient temperature, battery temperature, engine compartment temperature, engine oil temperature, intake manifold pressure, accelerator pedal position, ignition switch position, throttle valve position, intake air temperature, exhaust gas oxygen or other exhaust gas component concentration or presence, intake air flow, transmission gear, ratio, or mode, transmission oil temperature, transmission turbine speed, torque converter bypass clutch status, deceleration, or shift mode, for example.

Although not explicitly illustrated, those of ordinary skill in the art will recognize various functions or components that may be controlled by the controller 30 within each of the subsystems identified above. Representative examples of parameters, systems, and/or components that may be directly or indirectly actuated using control logic executed by the controller include fuel injection timing, rate, and duration, throttle valve position, spark plug ignition timing (for spark-ignition engines), intake/exhaust valve timing and duration, front-end accessory drive (FEAD) components such as the alternator, air conditioning compressor, battery charging, regenerative braking, transmission clutch pressures, and the like.

The controller 30 may receive data from and issue commands to vehicle charging system components 12, such as the alternator 14. The controller 30 may command that the alternator 14 operate in a steady state condition or a transient condition. The controller 30 may command various alternator set points for the alternator output voltage or the alternator output current. The set point may represent a target alternator output voltage or a target alternator output current.

The steady state condition of the alternator 14 may begin as a voltage associated with the alternator 14 approaches the target alternator output voltage or alternator output voltage set point. The steady state condition of the alternator 14 may begin as a current associated with the alternator 14 approaches the target alternator output current or alternator output current set point.

The transient condition of the alternator 14 may occur in various situations. The transient condition may occur as a voltage associated with the alternator 14 attempts to satisfy the target alternator output voltage or alternator output voltage set point. The transient condition may occur as a current associated with the alternator 14 attempts to satisfy the target alternator output current or alternator output current set point.

The transient conditions may be associated with the following scenarios. The alternator output voltage or current may be restricted to reduce torque on the alternator 14. The alternator 14 may be operating in a full field condition. The alternator output voltage or current is restricted while the alternator output current or voltage is ramping up or down in an effort to minimize alternator operation at inefficient operating points. The alternator 14 may be operating in a load response mode.

The controller 30 may receive data from and issue commands to the power electronics 18. The power electronics 18 may include vehicle fuses, relays and a vehicle power distribution point from which electric power may be provided to various vehicle electronic components. The power distribution point may have an associated power distribution point voltage.

The controller 30 may receive data from and issue commands to the body control module 34. The body control module 34 may be an electronic control unit that may monitor and control various electronic accessories in the vehicle 10. The body control module 34 may monitor or control a vehicle stereo, power windows, power mirrors, vehicle locks, interior lighting, exterior lighting, etc.

The body control module 34 may have an input that may receive a voltage proximate the distribution point voltage. The body control module voltage input may be a high impedance input with a high resolution that may filter out transients in the current received at the input.

The controller 30 may receive data from and issue commands to the vehicle display interface 36. The vehicle display interface 36 may display various status indicators including a vehicle charging system status indicator. The vehicle charging system status may indicate whether the vehicle charging system is operating normally or has experienced a fault condition.

In some circumstances the connectors that couple the output terminal 24 of the alternator 14 to the battery 16 may not be torqued to factory specification which may increase the voltage drop across the connections. Should at least one connector become disconnected, the voltage drop (difference between the measured voltage at the battery 16 and the measured voltage at the output terminal 24) may become very large and may be easily detectable by a monitoring system.

Should a connector between the alternator 14, the battery 16, or an intervening component become loose, the voltage drop may not be large enough to be detected by a monitoring system. The connector may become loose due to a fastener associated with the connector loosening due to vehicle vibration, harshness, or the fastener not being torqued to specification. A loose connector may reduce the amount of electrical power delivered to the battery 16 and subsequently distributed to vehicle electrical components.

The controller 30 may be programmed to output for display via the vehicle display interface 36 a warning indicator or alert indicative of a vehicle charging system fault condition. In order to determine when to output the warning or alert, the controller 30 may monitor the resistance of a connection associated with the alternator 14, the battery 16, the power electronics 18, the power distribution point, or the body control module 34 while the battery 16 is under charge and the alternator 14 is operating proximate a steady state condition.

The resistance of the connection may be compared to a threshold connector resistance. If the resistance of the connection exceeds the threshold connector resistance, a warning or alert indicative of a vehicle charging system fault may be output for display.

The threshold connector resistance may be based on a signal indicative of a temperature from the temperature sensor 38 and an expected/calibrated connection resistance of the connection. The expected/calibrated connection resistance of the connection may be the base cable resistance subject to a multiplier that may vary based on the number of interconnects between the output terminal 24 and the power distribution point of the power electronics 18.

The controller 30 may determine or calculate the connection resistance based on a quotient of a difference between a voltage drop associated with the alternator 14 and a voltage associated with a power distribution point of the power electronics 18 and an output current of the alternator 14. The quotient may be expressed as Equation 1 as illustrated below.

$$\text{Resistance} = \frac{\text{Alternator Voltage} - \text{Distribution Voltage}}{\text{Alternator Current}} \quad \text{Equation (1)}$$

The alternator voltage may be the alternator output voltage. The alternator output voltage may be the alternator output voltage set point provided by the controller 30 as a target alternator output voltage that the alternator 14 may operate at upon achieving a steady state condition.

The distribution voltage may be a voltage associated with the power distribution point of the power electronics 18. The distribution voltage may be approximated by measuring the body control module 34 input voltage.

The distribution voltage may be based on a combination of a current associated with the battery 16 (battery current) and a resistance associated with the battery 16 (battery resistance) or a resistance associated with the power distribution point of the power electronics 18.

The distribution voltage may be based on a difference between the voltage associated with the battery 16 and a voltage drop associated with an electrical connection extending between the battery 16 and the power distribution point of the power electronics 18. The voltage associated with the battery 16 may be provided by the battery monitoring system 32 or a battery voltage sensor disposed proximate the battery 16 to the controller 30.

The numerator of Equation (1) may represent the voltage drop associated with the alternator 14. The voltage drop may be defined by a difference between the alternator output voltage and the voltage associated with the power distribution point of the power electronics 18. The alternator output voltage may be directly measured by a voltage sensor disposed proximate the alternator 14 or provided by the voltage regulator 22 to the controller 30.

The alternator current may be an output current associated with the alternator 14. The alternator current may be defined by direct measurement of the alternator output current by a current sensor disposed proximate the output terminal 24 or proximate a cable associated with the output terminal 24. The alternator current may alternatively be a function of a speed associated with the engine 20 and the excitation current associated with the alternator 14. Various alternator output currents based on the engine speed, ambient temperature, and the excitation current may be provided as part of a look up table and determined by characterization tests.

Figure 2:
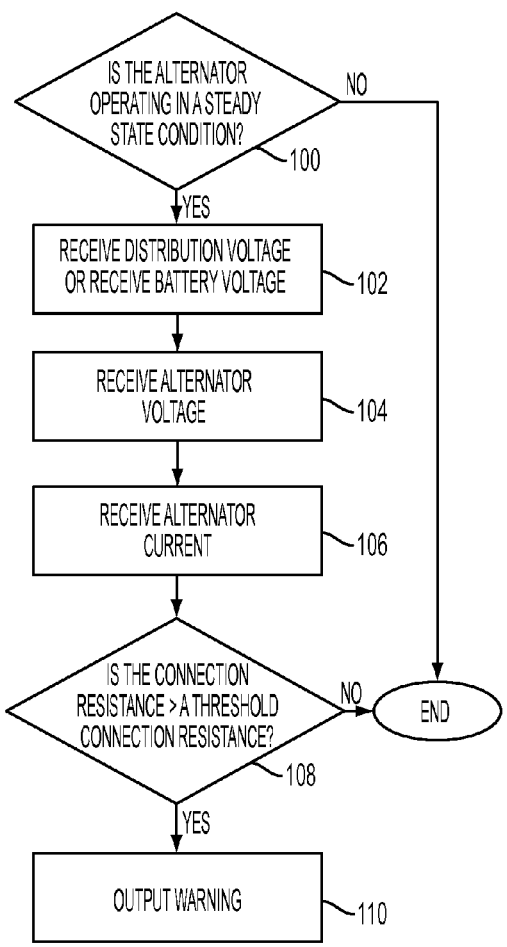
FIG. 2 is a flow chart according to a method of the present disclosure.

FIG. 2 is a flow chart of a method of detecting a vehicle charging system fault. The method may be implemented by the controller 30 based on data received by the controller 30. At block 100, the method may determine if the alternator 14 is operating in a steady state condition. The alternator 14 may be operating at a steady state condition when the alternator output voltage approaches a voltage set point or a target voltage. The alternator 14 may be operating at a steady state condition when the alternator output current approaches a current set point or a target current. If the alternator 14 is not operating at a steady state condition, the method may end. Should the alternator 14 be operating in a steady state condition, the method may continue to block 102.

At block 102, the method may receive a distribution voltage or a battery voltage. The distribution voltage may be a voltage associated with the power distribution point of the power electronics 18. The distribution voltage may be determined by a direct measurement made at the power distribution point of the power electronics 18. The distribution voltage may be calculated based on a measured battery voltage and include a measured battery current multiplied by a battery cable resistance.

The distribution voltage may also be the body control module 34 input voltage, an inferred voltage based on a voltage associated with the battery 16 and a resistance associated with the battery 16, or a direct measurement of the voltage at the power electronics 18.

The battery voltage may be a voltage associated with the battery 16. The voltage associated with the battery 16 may be the voltage measured at the B+ connector of the battery 16.

At block 104, the method may receive an alternator voltage. The alternator voltage may be a voltage associated with the alternator 14.

At block 106, the method may receive an alternator current. The alternator current may be an alternator output current directly measured by a current sensor disposed proximate an output of the alternator 14 or proximate the B+ connector of the battery 16. The alternator current may alternatively be inferred by the method based on an engine speed and an alternator excitation current.

At block 108, the method may compare a connection resistance with a threshold connection resistance. The connection resistance may be defined by a quotient of a voltage drop associated with an alternator and an output current of an alternator. The voltage drop associated with an alternator may be the difference between the distribution voltage or battery voltage received at block 102 and the alternator voltage received at block 104. The output current of an alternator may be the alternator current received at block 106.

If the connection resistance calculated at block 108 does not exceed the threshold value of the connection resistance, the method may end. Should the connection resistance, calculated at block 108, exceed the threshold value of the connection resistance, the method may output for display a warning indicative of a vehicle charging system fault, at block 110.

Figure 3:
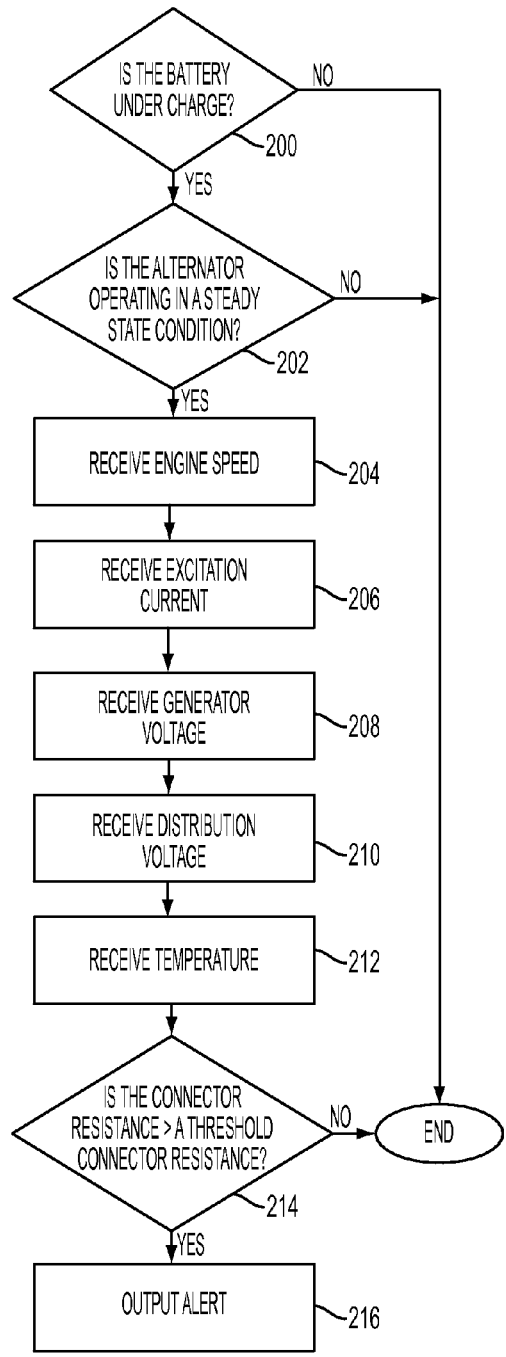
FIG. 3 is a flow chart according to a method of the present disclosure.

FIG. 3 is a flow chart of a method of monitoring a vehicle charging system. The method may be implemented by the controller 30 based on data received by the controller 30. At block 200, the method may determine if the battery 16 is under charge. If the battery 16 is not receiving charge from the alternator 14, the method may end. Should the battery 16 receive charge from the alternator 14, the method may continue to block 202.

At block 202, the method may determine if the alternator 14 is operating in a steady state condition. The alternator 14 may be operating in a steady state condition when the alternator output voltage or alternator output current approaches the set point. If the alternator 14 is not operating at a steady state condition, the method may end. Should the alternator 14 be operating in a steady state condition, the method may continue to block 204.

At block 204, the method may receive an engine speed. The engine speed may be provided by an engine speed sensor, a crank position sensor, resolver, etc. disposed proximate the engine 20. The method may alternatively receive an alternator 14 or generator speed provided by a generator speed sensor disposed proximate the generator.

At block 206, the method may receive an excitation current associated with the generator. The excitation current may be provided by a sensor disposed proximate the generator.

The method may calculate or determine a generator output current based on the engine speed or generator speed, received at block 204, and the excitation current, received at block 206.

At block 208, the method may receive a generator voltage. The generator voltage may be a voltage associated with the generator. The generator voltage may be a generator voltage set point provided by the controller 30 or a generator output voltage measured by a voltage sensor disposed proximate the generator output.

At block 210, the method may receive a distribution voltage. The distribution voltage may be a voltage associated with the power distribution point of the power electronics 18. The distribution voltage may be based on a body control module 34 input voltage or a voltage proximate the power electronics 18 measured by a voltage sensor.

The distribution voltage may also be inferred. For example, the distribution voltage may be inferred based on a current associated with the battery 16 and a resistance associated with the battery 16. The distribution voltage may be inferred based on a voltage associated with the battery 16 and a voltage drop associated with a connection extending between the battery 16 and the power distribution point of the power electronics 18. The voltage drop may be determined by a voltage difference between the battery output and the power distribution point of the power electronics 18, measured by a voltage sensor.

At block 212, the method may receive a temperature. The temperature may be an ambient temperature or other temperature associated with the vehicle provided by the temperature sensor 38. The temperature may affect the connector resistance of a connector extending between a combination of the generator, battery 16, and the power distribution point of the power electronics 18.

The method may estimate a threshold connector resistance based on the temperature and a predetermined connector resistance of the connector extending between a combination of the generator, battery 16, and the power distribution point of the power electronics 18.

At block 214, the method may compare a connector resistance with a threshold connector resistance. The connector resistance may be based on the generator output current, a difference between the generator voltage or battery voltage received at block 208 and the distribution voltage received at block 210, and the temperature received at block 212.

If the connector resistance exceeds a threshold connector resistance, at block 216, an alert indicative of a vehicle charging system fault may be output. Should the connector resistance not exceed a threshold value of the connection resistance, the method may end.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method of detecting a vehicle charging system fault comprising:
by a controller,
responsive to a connection resistance exceeding a threshold while an alternator is in steady state operation, displaying a warning, the connection resistance being derived by the controller as a quotient of
a difference between an output voltage measured via a voltage sensor at the alternator and a distribution voltage measured via a distribution voltage sensor at a control module input, and
an output current measured via a current sensor at the alternator.

2. The method of claim 1 wherein the steady state operation begins as an output voltage associated with the alternator approaches a voltage set point.

3. The method of claim 1 wherein the steady state operation begins as the output current approaches a current set point.

4. A vehicle power system comprising:
an alternator; and
a controller programmed to, responsive to a connection resistance exceeding a threshold while the alternator is in steady state operation, generating a warning, the connection resistance being derived by the controller as a quotient of
a difference between an output voltage measured via a voltage sensor at the alternator and a distribution voltage measured via a distribution voltage sensor at a control module input, and
an output current measured via a current sensor at the alternator.

5. The vehicle power system of claim 4 wherein the steady state operation begins as an output voltage associated with the alternator approaches a voltage set point.

6. The vehicle power system of claim 4 wherein the steady state operation begins as the output current approaches a current set point.

7. A vehicle power system comprising:
an alternator; and
a controller programmed to, responsive to a connection resistance exceeding a threshold while the alternator is in steady state operation, display a warning, wherein the connection resistance is derived by the controller as a quotient of
a difference between voltages measured by respective voltage sensors at the alternator and a power electronics, and
a current measured via a current sensor at the alternator.

* * * * *